United States Patent
Winscom et al.

(10) Patent No.: US 7,449,286 B2
(45) Date of Patent: Nov. 11, 2008

(54) METHOD OF FORMING CONDUCTIVE TRACKS

(75) Inventors: Christopher J. Winscom, Middlesex (GB); John R. Fyson, London (GB); Peter Hewitson, Middlesex (GB); Sean D. Slater, Meldreth (GB)

(73) Assignee: Eastman Kodak Company, Rochester, NY (US)

( * ) Notice: Subject to any disclaimer, the term of this patent is extended or adjusted under 35 U.S.C. 154(b) by 143 days.

(21) Appl. No.: 11/518,643

(22) Filed: Sep. 11, 2006

(65) Prior Publication Data

US 2007/0059646 A1 Mar. 15, 2007

(30) Foreign Application Priority Data

Sep. 13, 2005 (GB) ................. 0518612.7

(51) Int. Cl.
*G03C 5/18* (2006.01)
*G03C 5/26* (2006.01)
*G03C 5/00* (2006.01)

(52) U.S. Cl. ........................ 430/449; 430/311; 430/320

(58) Field of Classification Search ................. 430/449, 430/311, 320
See application file for complete search history.

(56) References Cited

U.S. PATENT DOCUMENTS

| 2,854,386 | A | 9/1958 | Lyman et al. |
| 3,223,525 | A | 12/1965 | Jonker et al. |
| 3,647,456 | A | 3/1972 | Herd et al. |
| 6,706,152 | B2 | 3/2004 | Deng et al. |

FOREIGN PATENT DOCUMENTS

GB 585035 1/1947

OTHER PUBLICATIONS

U.S. Appl. No. 11/400,928, filed Apr. 10, 2006, titled Method of Forming Conductive Tracks, by Fyson et al.

*Primary Examiner*—Geraldina Visconti

(57) ABSTRACT

A patterned electrical conductor having improved conductivity and controllably high resolution track and gap widths is obtained by exposing, to a desired conductive pattern, a pressure-sensitive or photosensitive element comprising a support and a pressure-sensitive or photosensitive material coated thereon being sensitive to the exposure (e.g. the wavelength of exposing radiation) and capable of providing a latent image upon exposure, and then developing the exposed element to form a developed element having a metal (e.g. silver) image thereon and then electroless plating and/or electroplating the metal image with a second metal (e.g. silver) whilst subjecting the developed element to ultrasonic agitation.

11 Claims, No Drawings

METHOD OF FORMING CONDUCTIVE TRACKS

FIELD OF THE INVENTION

The present invention relates to formation of conductive materials as conductive tracks for and in electronic circuit boards and devices utilising such conductive tracks. The invention is particularly concerned with an improvement in the resolution of conductive metal tracks obtained by a photographic method, such as on a flexible support.

BACKGROUND OF THE INVENTION

In the imaging, lighting, display and electronics industries, it is predicted that in order to meet consumer demands, and fuelled by industry competitiveness, electronics products will be required to be increasingly durable, thin, lightweight and of low cost. In a growing market where consumers are demanding more from portable electronic devices and displays such as mobile phones, laptop computers, etc., flexible displays and electronics have the potential to eliminate the rigid constraints of traditional flat panel displays and electronics products. The goal in displays and electronics is to produce thin, lightweight, flexible devices and displays with achievable power requirements at a minimal cost.

Traditionally electronic devices requiring multiple layers of circuits have been fabricated using multiple circuit boards, with circuitry formed on one or both sides thereof, which may be bonded together and connected to one another by drilling holes (or vias) in the circuit boards which are filled with conductive material. To make such multiple layer circuit boards, a copper coated insulating board made of a composite material is treated with a light-sensitive material, known as a photoresist, which is imaged with the pattern of the desired electronic circuit, typically by exposing the photoresist through a photomask. The resist is affected by the exposure such that the exposed and non-exposed parts can be differentiated in terms of ease or method of removal. The imaged resist is then treated to remove the resist in an image-wise manner to reveal bare copper. The bared copper is then etched away and then the remaining resist removed to reveal a copper track on the insulating board. A second board may be made in a similar way with its own circuit pattern and the two boards bonded together and optionally connected by drilling vias as mentioned above.

The process of making electronic circuit boards such as this can be quite laborious and involves several sequential steps.

Furthermore, using this method it is difficult to produce fine conductive tracks (e.g. less than 25 μm) on a printed circuit board, as the photoresist tends to delaminate and the UV source has to be highly collimated and scatter and reflections from the copper surface somehow minimised.

It is desirable to provide a solution to improve the efficiency of the electronic circuit manufacturing process and to enable electronic circuits, preferably with very small track widths, to be generated on flexible supports to meet the predicted growth in demand for flexible circuits and flexible and thin devices. A number of attempts to provide new manners of manufacturing electronic circuits have been previously disclosed, but the processes are often lengthy and laborious.

U.S. Pat. No. 2,854,386 relates to a method of photographically printing conductive metal patterns. As described therein, a thin layer of a photographic silver halide emulsion coated onto a support is exposed according to a desired pattern through a master transparency to generate a latent image which forms a dense and visible silver image upon development, preferably with a high contrast, non-fogging developer. The visible silver image formed is a negative of the final desired pattern. An oxidising etch solution is then applied which oxidises the metallic silver and simultaneously softens the associated gelatin thereby removing the gelatin from the support to leave a residual gelatin image. A latent silver image is formed in the residual gelatin image by re-exposing the whole support to actinic radiation and the silver nuclei act as seeds in the subsequent physical development step to form a heavy continuous conductive silver deposit. The resulting conductive silver pattern may be plated with copper or other metal according to standard electroplating techniques. In a second described embodiment, the emulsion is of a wash-off type emulsion comprising unhardened gelatin and a light sensitive tanning agent. The emulsion layer is exposed according to the desired pattern and non-pattern areas of gelatin removed by a wash-off developer to form a gelatin image of the desired pattern. A preliminary silver image is formed in the gelatin image by treating it with an alkaline solution and a silver salt, such as silver nitrate, whereby silver oxide particles are formed in the gelatin image, which then form the nuclei for forming a silver deposit via a physical development process and may optionally be electroplated with copper or other metal.

U.S. Pat. No. 6,706,165 describes a way of making metallic structures, which are presumably conducting by forming a silver image which is then grown in an electroless-plating bath to make it conductive and then electroplating this grown image to form the conducting metal structure. This process is relatively laborious and complicated. GB-A-0585035 describes a process for making conducting tracks, including an electroless plating process, which may or may not be followed by an electroplating step.

U.S. Pat. No. 3,647,456 relates to a method of making electrically conductive silver images with the object of providing such electrically conductive silver images having high spatial resolution, which conducting silver image may be advantageously utilised in printed circuit techniques thereby eliminating the need for an aluminium layer in photoresists and establishing a silver pattern directly upon a wafer. There is described the use of a coating of silver bromide emulsion comprising cadmium iodide on a substrate to produce a latent image on the substrate, developing the latent image using a high resolution developer to provide a silver image and heating the silver image at a temperature of from 200° C. to 450° C. to render the silver image electrically conductive.

U.S. Pat. No. 3,223,525 describes a method of manufacturing, by photographic means, external electrically conductive noble-metal patterns on non-conductive supports. In the described method, a non-conductive support is treated with a light sensitive compound such as silver halide, exposed to light to produce a silver or mercury germ image, which is then treated with a stabilised physical developer for a prolonged period of time whereby the internal image is made to grow out beyond the surface of the support to be come an external image having resistance of less than $10^4$ ohms per square.

One problem is that, for example, in the method of U.S. Pat. No. 3,223,525, the physical development process is slow and methods of speeding up the process, such as increasing the concentration of the development solution or raising the temperature may cause increased background deposition thereby increasing the likelihood of short circuits occurring.

The various alternative methods of generating conductive circuit patterns illustrated in the above-referenced documents each have advantages as described therein, but do not provide a more efficient and improved method of manufacturing conductive tracks.

PROBLEM TO BE SOLVED BY THE INVENTION

It is desirable to provide an efficient method of forming conductive tracks which involves fewer steps in fabrication as compared with traditional printed circuit board manufacture and which can be formed on flexible supports.

It is still further desirable to provide a method capable of forming conductive tracks or conductive areas having excellent conductivity and having tracks and gaps with very high resolution to meet the demands of increasingly complex circuitry of high-tech devices.

SUMMARY OF THE INVENTION

According to a first aspect of the invention, there is provided a process for preparing a patterned electrical conductor comprising a conductive track pattern on a support, said process comprising the steps of providing a pressure-sensitive or photosensitive element comprising a support substrate and a pressure-sensitive or photosensitive material coated onto the support, said pressure-sensitive or photosensitive material being capable of providing a latent image upon exposure to pressure or sensitising radiation and comprising a pressure-sensitive or photosensitive metal salt dispersed in a binder; exposing the pressure-sensitive or photosensitive element to pressure or sensitising radiation according to a desired conductive track pattern to form a latent image on the element; subjecting the latent image to a conventional development step to form a developed element having an image formed by a first metal corresponding to the desired conductive track pattern; and electroless plating and/or electroplating said metal image with a plating of a second metal to improve the conductivity of said metal image, wherein during the electroless plating and/or electroplating step(s) the developed element is subjected to ultrasonic agitation.

In a second aspect of the invention, there is provided a patterned electrically conductive element comprising a conductive track pattern on a support substrate, said element being obtainable by the above process.

In a third aspect of the invention, there is provided a patterned electrically conductive element comprising a conductive track pattern on a support substrate, wherein the conductive track pattern comprises of lines having a width of 15 µm or less and the element has a sheet resistance of 10 ohms/square or less and an optical transmission of greater than 90%.

ADVANTAGEOUS EFFECT OF THE INVENTION

The process of preparing a patterned electrical conductor according to the invention provides a quicker, more efficient method of manufacturing conductive tracks, which may be formed on a flexible support. In particular, the use of ultrasonic agitation during plating of the developed image enables conductive tracks with improved conductivity, higher resolution (tracks and gaps) and reduced susceptibility to unwanted circuit shorting to be generated. The method may therefore be find particular utility in the formation of conductive tracks having tightly controlled conductivity, track width and gap width according to the desired utility.

DETAILED DESCRIPTION OF THE INVENTION

The process of the present invention involves generating a latent image through exposure of a pressure sensitive or photosensitive metal salt in a binder according to a desired pattern followed by development to form a corresponding metal image. In order to improve the form and conductivity of the metal image, it is desirable to plate the metal image, by electroless plating (i.e. physical development) and/or electroplating (i.e. electrochemical development). Preferably, the developed metal image is capable of carrying a current (i.e. is conductive) and can be electroplated without needing an electroless plating step.

It has been found by the inventors that by subjecting the developed element to ultrasonic agitation during the electroless and/or electroplating step(s), more conductive tracks with improved resolution can be formed in a shorter time.

Without being bound by theory, it is believed that the effect of ultrasonic agitation during plating is to increase the relative concentration of the second metal in the plating solution immediately adjacent the metal tracks being plated. It is believed that under normal circumstances, plating of the metal track results in depletion of the concentration of the plating metal in the solution immediately surrounding the metal track, which we will refer to as the depletion zone. The dynamics of solutions are such that it takes time for the fluid in the depletion zone to be replenished of plating metal. The rate of plating is considered to be proportional to the concentration of plating metal in the plating solution (and specifically, it is believed to be proportional to the concentration of plating metal in the depletion zone).

In the absence of ultrasonic agitation, the rate of plating can be increased by increasing the overall concentration of the plating solution. This leads to an increase in the effective concentration of the plating metal in the vicinity of the tracks to be plated, but does not increase the relative concentration (because the concentration of plating metal in the plating solution adjacent non-imaged areas of the element is also increased). Accordingly, whilst this increases the rate of plating of the tracks, it also increases the rate of plating of non-imaged areas.

By subjecting the element to ultrasonic agitation in accordance with the process of the present invention, it is believed that the depletion zone is disrupted, enabling diffusion in of plating metal from the bulk of the plating solution, leading to an increased effective concentration of plating metal in the solution adjacent the tracks to be plated and an increased relative concentration (since the concentration of the plating metal in the non-imaged areas is not increased). Thus the relative rate of plating of the tracks is increased.

As a consequence of this, the relative amount of background plating is minimised, thus reducing the likelihood of shorts occurring and enabling a transparent support to remain largely transparent.

The effect of the invention is particularly beneficial when an electroless plating method is used.

To subject the developed element to ultrasonic agitation during the plating step(s), the plating step may be carried out in an ultrasonic bath, for example, or an ultrasonic probe placed in the plating solution, or alternatively ultrasonic pads attached directly to the developed element itself (e.g. to the reverse side of the element). In any case, any suitable method of subjecting the developed element to ultrasonic waves during plating is considered within the scope of the invention. The frequency of ultrasound used typically depends upon the available transducers, which are usually in the range 30-100 kHz and normally about 60 kHz.

The support substrate may be any suitable support substrate and may be rigid or flexible, transparent or opaque. Suitable support substrates include, for example, PET (polyethylene teraphthalate), cellulose triacetate, PEN, and glass.

The substrate upon which the pressure-sensitive or photosensitive material utilised may be coated depends upon the intended utility. The substrate may be rigid or flexible but is preferably flexible. Suitable such substrates include rigid, glass-reinforced epoxy laminates, metal pads and semiconductor components, adhesive coated polymer substrates, printed circuit board (PCB) substrates including polymer based PCBs, ceramic substrates, polymer tapes (e.g. dielectric green tape for multi-layer ceramic devices), paper, gloss art paper, bond paper, semi-synthetic paper (e.g. polyester fibre), synthetic paper (e.g. Polyart™), resin coated paper, polymer substrates and composite materials. Suitable polymers for use as polymer substrates include polyethylene, polypropylene, polyester, polyamide, polyimide, polysulfone and mixtures thereof. The substrate, especially a polymer substrate, may be treated to improve adhesion of the silver halide emulsion to the substrate surface. For example, the substrate may be coated with a polymer adhesive layer or the surface may be chemically treated or subjected to a corona treatment.

For coating onto a substrate in the manufacture of flexible electronic devices or components, the support is preferably flexible, which aids rapid roll-to-roll application.

An Estar® polyethylene terephthalate support or a cellulose triacetate support is preferable.

Alternatively, the support may be the same support used in a flexible display device, by which it is meant that pressure-sensitive or photosensitive coating may be coated onto the back of a support for a display device and imaged in situ according to a desired pattern and processed in situ.

Where a discrete support is utilised (i.e. the support is not the reverse side of a support for a flexible display device), it can be coated with a photosensitive and/or a pressure sensitive layers on either side or both sides provided that either the same pattern is desired for both sides or the support is such that formation of the latent image on one side of the support will not fog the coating on the other side of the support.

The pressure sensitive or photosensitive material may be any suitable material capable of providing a latent image (i.e. a germ or nucleus of metal in each exposed grain of metal salt) according to a desired pattern upon pressure or photo exposure and that comprises a pressure sensitive or photosensitive metal salt, which is developable into a metal image, and a binder in which the metal salt can be dispersed.

Preferably, the binder is a hydrophilic colloid such as gelatin or gelatin derivative, polyvinylpyrrolidone or casein and may contain a polymer. Suitable hydrophilic colloids and vinyl polymers and copolymers are described in Section IX of Research Disclosure Item 36544, September 1994, published by Kenneth Mason Publications, Emsworth, Hants, PO10 7DQ, UK. The preferred hydrophilic colloid is gelatin.

The pressure sensitive or photosensitive metal salt is preferably selected from salts of copper, nickel, gold, platinum and silver. Metal salts with an oxidation state of +1 are preferred and particularly preferred are silver (I) salts, which is preferably a silver halide.

The silver halide may be, for example, silver chloride, silver bromide, silver chlorobromide, silver bromoiodide, etc. Preferably, the silver halide dispersion (or emulsion as it is called in the photographic arts) in the binder is a high contrast silver halide emulsion, which is suitable for use in the graphic arts and in manufacturing printed circuit boards, for example. The silver halide emulsion is preferably a chlorobromide emulsion, preferably comprising at least 50 mole % silver chloride, more preferably 60-90 mole % silver chloride and most preferably 60-80 mole % silver chloride. The remainder of the silver halide is preferably substantially made up of silver bromide and more preferably comprises a small proportion (e.g. up to 1 or 2%) of silver iodide.

Preferably, the pressure-sensitive or photosensitive material is a high metal (e.g. silver)/low binder (e.g. gelatin) material, so that after conventional development, it is sufficiently conductive to enable direct electroplating of the metal pattern formed. In this regard, a preferred ratio of binder to metal in the pressure-sensitive or photosensitive material is in the range of from 0.1 to 0.7, more preferably from 0.2 to 0.6.

The first metal is the corresponding metal of the pressure sensitive or photosensitive metal salt and accordingly the first metal is preferably silver.

Preferably, the material is a photosensitive material.

According to the preferred embodiment, where the metal salt is a photosensitive metal salt, preferably silver halide, the metal may be sensitised to any suitable wavelength of the exposing radiation, as desired, but is preferably sensitised to light of the wavelengths emitted by solid state diode red light sources commonly used in imagesetters and photoplotters. Preferably, the metal salt dispersion is a silver halide emulsion is sensitised to light in the range 600-690 nm.

The amount of sensitising dye used in a silver halide emulsion is preferably in the range of 50 to 1000 mg per mole equivalent of silver (mg/Agmol), more preferably 100 to 600 mg/Agmol and still more preferably 150 to 500 mg/Agmol. It is most preferable to incorporate the sensitising dye into the silver halide emulsion in an amount of from 300 to 500 mg/Agmol.

The emulsions employed in the materials described herein, and the addenda added thereto, the binders, etc., may be as described in Research Disclosure Item 36544, September 1994, published by Kenneth Mason Publications, Emsworth, Hants, PO10 7DQ, UK.

The photosensitive materials described herein preferably include an antihalation layer that may be on either side of the support, preferably on the opposite side of the support from the photosensitive layer. In a preferred embodiment, an antihalation dye is contained in an underlayer of a hydrophilic colloid. Suitable dyes are listed in the Research Disclosure above.

The silver halide emulsions referred to may be prepared by any common method of grain growth, preferably using a balanced double run of silver nitrate and salt solutions using a feedback system designed to maintain the silver ion concentration in the growth reactor. Dopants may be introduced uniformly from start to finish of precipitation or may be structured into regions or bands within the silver halide grains. Dopants, for example osmium dopants, ruthenium dopants, iron dopants rhenium dopants or iridium dopants, for example cyanoruthenate dopants, may be added, preferably a combination of osmium and iridium dopants and preferably where the osmium dopant is an osmium nitrosyl pentachloride (especially in combination with a red-sensitising trinuclear merocyanine dye). Such complexes may alternatively be utilised as grain surface modifiers in the manner described in U.S. Pat. No. 5,385,817. Chemical sensitisation may be carried out by any of the known methods, for example with thiosulphate or other labile sulphur compound, and with gold complexes. Preferably, the chemical sensitisation is carried out with thiosulphate and gold complexes.

The silver halide grains may be cubic, octahedral, rounded octahedral, polymorphic, tabular or thin tabular emulsion grains, preferably cubic, octahedral or tabular grains. Such silver halide grains may be regular untwinned, regular twinned, or irregular twinned with cubic or octahedral faces. The silver halide grains may also be composed of mixed halides.

In cases where the emulsion composition is a mixed halide, the minor component may be added in the crystal formation or after formation as part of the sensitization or melting. The emulsions may be precipitated in any suitable environment such as a ripening environment, a reducing environment or an oxidizing environment.

Specific references relating to the preparation of emulsions of differing halide ratios and morphologies are Evans U.S. Pat. No. 3,618,622, Atwell U.S. Pat. No. 4,269,927, Wey U.S. Pat. No. 4,414,306, Maskasky, U.S. Pat. No. 4,400,463, Maskasky U.S. Pat. No. 4,713,323, Tufano et al, U.S. Pat. No. 4,804,621, Takada et al U.S. Pat. No. 4,738,398, Nishikawa et al U.S. Pat. No. 4,952,491, Ishiguro et al U.S. Pat. No. 4,493, 508, Hasebe et al U.S. Pat. No. 4,820,624, Maskasky U.S. Pat. No. 5,264,337 and 5,275,930, House et al U.S. Pat. No. 5,320, 938 and Chen et al U.S. Pat. No. 5,550,613, Edwards et al U.S. Ser. No. 08/362,283 filed on Dec. 22, 1994 and U.S. Pat. Nos. 5,726,005 and 5,736,310.

Antifoggants and stabilisers may be added, after addition of sensitising dye to give the emulsion the desired sensitivity, if appropriate, as is known in the art. Antifoggants that may be useful include, for example, azaindenes such as tetraazaindenes, tetrazoles, benzotriazoles, imidazoles and benzimidazoles. Specific antifoggants that may be used include 5-carboxy-2-methylthio-4-hydroxy-6-methyl-1,3,3a,7-tetraazaindene, 1-(3-acetamidophenyl)-5-mercaptotetrazole, 6-nitrobenzimidazole, 2-methylbenzimidazole and benzotriazole.

Nucleators and, preferably, development boosters may be used to give ultra-high contrast, for example combinations of hydrazine nucleators such as those disclosed in U.S. Pat. No. 6,573,021, or those hydrazine nucleators disclosed in U.S. Pat. No. 5,512,415 at column 4, line 42 to column 7, line 26, the disclosures of which are incorporated herein by reference. Booster compounds that may be present in the photographic material (or alternatively, in the developer solution used) include amine boosters that comprise at least one secondary or tertiary amino group and have an n-octanol/water partition coefficient (log P) of at least 1, preferably at least 3. Suitable amine boosters include those described in U.S. Pat. No. 5,512,415, column 7, line 27 to column 8, line 16, the disclosure of which is incorporated herein by reference. Preferred boosters are bis-tertiary amines and bis-secondary amines, preferably comprising dipropylamino groups linked by a chain of hydroxypropyl units, such as those described in U.S. Pat. No. 6,573,021. Any nucleator or booster compound utilised may be incorporated into the silver halide emulsion, or alternatively may be present in a hydrophilic colloid layer, preferably adjacent the layer containing the silver halide emulsion for which the effects of the nucleator are intended. They may, however, be distributed between or among emulsion and hydrophilic colloid layers, such as undercoat layer, inter-layers and overcoat layers.

Preferably, a photosensitive silver halide material such as that described in U.S. Pat. No. 5,589,318 or U.S. Pat. No. 5,512,415 is utilised.

The latent image formed in the process of the invention is subjected to a conventional development step, whereby a developed image of a first metal according to the latent image is formed.

The conventional development step comprises treating the latent image with a developer composition, which may be incorporated in the coating, but requiring activation (e.g. by heating, i.e. thermal development, or changing pH), or may be added as a solution as part of a development process. The developer composition typically comprises a reducing agent capable of reducing the metal salt to the elemental metal, when catalysed by the elemental particles of the latent or germ image under the conditions of the development process.

The development step may further comprise of fixing the image by treating the developed image with a fixer composition and/or a wash step whereby the active fixer and developer components are removed and the majority of unhardened binder (e.g. gelatin) in the non-imaged areas is removed, although a residue typically remains around the tracks.

In a preferred embodiment of the process of the invention, the developed element is subjected to a hot-fix step in order to remove unwanted residual gelatin from non-imaged areas thereof. Preferably, according to this embodiment, the latent image is formed on an element comprising a silver halide emulsion in gelatin as binder. After development, the developed element is immersed in a fix solution, such as the Kodak RA 3000™ fix, at an elevated temperature (e.g. at least 30° C., preferably 35-45° C.) which causes softening of the gelatin in unexposed regions and melting, dissolution or delamination thereof to leave only the exposed silver tracks as a relief image. The hot fix is more efficient and also rids the developed element of residual undeveloped silver halide grains which otherwise are at risk of being plated in subsequent steps. The gelatin in and beneath the tracks formed is unaffected by the hot-fix/wash since it is less accessible, is held together by the tracks themselves and is hardened somewhat by side products of the development step.

In a preferred embodiment, where the metal salt is a pressure sensitive or photosensitive silver halide, it may be processed following exposure to form a visible image by associating the silver halide with an aqueous alkaline medium in the presence of a developing agent contained in the medium or in the material itself. The material may be processed in conventional developers to obtain very high contrast images. When the material contains an incorporated developing agent, it can be processed in the presence of an activator, which may be identical to the developer in composition, but lacking a developing agent.

The developers are typically aqueous solutions, although organic solvents, such as diethylene glycol, can also be included to facilitate the solution of organic components. The developers contain one or a combination of conventional developing agents, such as for example, a polyhydroxybenzene such as dihydroxybenzene, aminophenol, a paraphenylenediamine, ascorbic, acid erythorbic acid and derivatives thereof, pyrazolidone, pyrazolone, pyrimidine, dithionite and hydroxylamine.

It is preferred to employ hydroquinone and 3-pyrazolidone developing agents in combination or an ascorbic acid-based system in the development of silver halide latent images. An auxiliary developing agent exhibiting super-additive properties may also be used. The pH of the developers can be adjusted with alkali metal hydroxides and carbonates, borax and other basic salts. It is a particular advantage that the use of nucleators as described herein reduces the sensitivity of photosensitive material to changes in this developer pH.

To reduce swelling of a hydrophilic binder (e.g. gelatin) during development, compounds such as sodium sulfate may be incorporated into the developer. Chelating and sequestering agents, such as ethylenediamine tetraacetic acid or its sodium salt, can be present. Generally any conventional developer can be used in the practice of this invention. Specific illustrative photographic developers are disclosed in the Handbook of Chemistry and Physics, 36$^{th}$ Edition, under the title "Photographic Formulae" at page 30001 et seq. and in "processing Chemicals and Formulas", 6$^{th}$ Edition, published by Eastman Kodak Company (1963).

The developed element is subjected to an electroless plating step and/or (preferably) an electro plating step.

By electroless plating (or physical development step), it is meant that the metal image formed by conventional development is treated with a solution of a metal salt or complex of the same, or different, metal as that formed by conventional development of the latent image.

By subjecting the developed element to an electroplating step (or electrochemical development), optionally after electroless plating, it is meant that a conductive metal image formed by conventional development and/or physical development has a voltage applied across it in the presence of a plating solution comprising a salt or complex of a plating metal, which may be the same or different to that of the metal image to be plated, whereby the conductive metal image is made more conductive. Suitable metals for use as the second metal (through electroless or electroplating) include, for example, copper, lead, nickel, chromium, gold and silver, preferably copper or silver and most preferably silver.

Preferably, the plating solution used in the physical development process (i.e. electroless plating) comprises ion of the plating metal in an amount of from 0.01 M to 2 M, more preferably 0.02 M to 0.1 M.

Where the development of the exposed photosensitive element comprises a conventional development step and an electrochemical development step (i.e. direct electroplating of a developed image), it is necessary that the image formed by conventional development is sufficiently conductive when a voltage is applied across it. In this case, it is preferable to use the electroplating technique described in our U.S. patent application Ser. No. 11/400,928 entitled, "Method of Forming Conductive Tracks".

The electroplating step of the process is achieved by providing a plating solution in contact with the developed metal image whilst applying a voltage across the photographically generated pattern through the solution by making the photographically generated pattern the negatively charged electrode (referred to as the cathode in electrochemistry) in an electrochemical cell. The plating solution utilised according to the process of the invention may be, for example, a solution of a silver thiosulfate complex, e.g. $Na_3Ag(S_2O_3)_2$, where silver is the plating metal (the second metal), a solution of copper sulfate optionally with or without a polyethylene glycol PEG 200 where copper is the plating metal, nickel sulfate, i.e. $NiSO_3$, in the presence of boric acid where nickel is the plating metal, or zinc sulfate, $ZnSO_4$, where zinc is the plating metal. Preferably the plating solution has an equivalent concentration of the plating metal of from 0.01 to 2 molar, more preferably 0.03 to 0.5 molar and still more preferably 0.05 to 0.2 molar. Boric acid to control pH and/or PEG as a throwing agent may optionally be added to any of the plating solutions utilised.

The conductive patterns formed by the method of the invention preferably have a conductivity (expressed as resistivity) of 50 ohms/square or less, being achievable with the preferred silver halide emulsions and a conventional development step, more preferably 10 ohms/square or less, still more 1 ohms/square or less. By exposing a coated support of the type used in the method of the invention to a desired pattern and processing the exposed layer with a conventional development step and a physical development step, a conductivity of 0.2 ohms/square is readily achievable. By further adopting a electrochemical development (electroplating) step, conductivity of about 10 milliohms/square is achievable.

As mentioned above, silver is preferably the plating metal, so a solution of a silver salt or complex is preferably used. The silver salt is preferably a silver thiosulfate complex, e.g. $Na_3Ag(S_2O_3)_2$, and can be formed by making a solution of silver chloride, sodium sulfite and ammonium thiosulfate. Preferably, the silver plating solution has an equivalent concentration of silver of from 0.01 to 2 molar, more preferably 0.03 to 0.5 molar and still more preferably 0.05 to 0.2 molar. The low equivalent concentration of silver in the plating solution enables the plating process to be controlled, allowing even plating across the patterned conductor and minimising the build-up of plating metal close to the electronic contacts.

The formulation of metal salts for use in the plating solution may be adapted from any suitable plating solution formulation, a useful source of known plating solution formulations includes "Modern Electroplating" 4$^{th}$ Edn, Ed. M. Schlesinger, M. Pacinovic; published by Wiley.

Preferably, the patterned electrical conductor has a surface conductivity of 40 ohms/square or less. The voltage applied across the patterned conductor is preferably up to 2 V, more preferably up to 1 V.

In a preferred embodiment of the process of the invention, the binder in the pressure-sensitive or photosensitive material is susceptible to decomposition and/or dissolution upon treatment with an enzyme solution and the process further comprises treating the developed element, prior to and/or during the plating step(s), with an enzyme capable of decomposing and/or dissolving the binder. The enzyme treatment step is preferably carried out in the manner described in our co-pending UK patent application No. 0518613.5 of even date, entitled "Method of Forming Conductive Tracks", the contents of which are incorporated herein by reference.

The enzyme used is selected according to the binder in the element in which the conductive tracks are formed and may be selected depending upon the activity of a certain enzyme with the binder being used. The enzyme is typically used as a solution in which the developed metal image is immersed (or may be provided as a thin process coating). Another consideration in the choice of enzyme is the pH at which the enzyme works. The choice of enzyme may therefore be affected by the pH of the plating solution or of the wash/fix solution, especially if the enzyme treatment step is to be carried out within another step.

The amount of enzyme and the concentration of the solution used depends upon several factors, such as the activity of the enzyme on the binder used, whether or not the binder has been hardened or cross-linked, the pH of the enzyme solution and the duration of treatment. The amount of enzyme used and the duration of treatment may be altered as appropriate to maximise the effect of the residual binder removal process whilst ensuring the track pattern is not disrupted (since it is bound to the support by the binder composition itself). Typically, for use with an exposed and developed high silver/low gelatin element, an enzyme solution (whether as part of a plating solution or not) comprises from 0.5 to 20 g/l of enzyme, preferably 1 to 10 g/l, and the duration of treatment is from 10 seconds to 10 minutes, preferably 30 seconds to 3 minutes. Typically, the enzyme treatment will be carried out at 40° C. or below.

Where the latent image is formed upon the coated support by applying pressure thereto according to a pattern, the degree of pressure to be applied is commensurate with the pressure sensitivity of the coated support, which could depend upon the precise nature of the coated support and would be readily appreciated by the skilled person in the art. The method of applying pressure to generate a latent image is any suitable method by which a desired image can be applied, using any suitable pressurising device. For example, the latent image may be formed by applying pressure using a stylus (especially a high resolution stylus) or scalpel, an engraved stamp engraved according to the desired track pattern or a roller carrying a relief pattern according to the desired track pattern such that latent images can be formed rapidly on a sequence of coated supports, especially flexible coated supports. Where the desired track pattern is a random conductive track pattern, the latent image may be formed by any suitable means of generating a random pattern such as by rubbing the surface of the coated support with steel wool.

The resolution of the conductive tracks formed depends primarily on the resolution of the pressurising or photo-imaging device since the process of the invention provides that subject to this limitation, very high resolution track and gap widths are achievable (e.g. upwards of 0.1 µm). For many applications, it is preferred to form high resolution conductive tracks. Preferably, therefore, the conductive tracks formed have a line width of 50 µm or less, more preferably 20 µm or less, still more preferably 15 µm or less, more preferably still 10 µm or less and most preferably 5 µm or less. Advantageously, for some application, line widths of 1 or 2 µm may be formed and preferably for ease of use the line widths are at least 0.1 µm, preferably 0.5 µm wide.

The process of the invention provides the additional benefit that where a transparent substrate is utilised, the deposition of plating metal on the non-imaged areas is minimised such that the use of this process to form conductive tracks on transparent supports (e.g. for display devices) is a realistically achievable option. Preferably, in such an embodiment, the conductive element has an optical transmission of at least 80%, more preferably at least 90%.

According to an alternative embodiment where the latent image formed is heat developed to generate tracks according to the desired track pattern, the pressure-sensitive or photosensitive material comprises a pressure sensitive or photosensitive silver halide material and a secondary source of reducible silver ions in catalytic proximity thereto.

Preferably, according to this embodiment of the invention, the silver halide material comprises that described generally above or more particularly one or more silver halides (often referred to as photocatalysts in the PTG imaging arts) such as silver bromide, silver iodide, silver chloride, silver bromoiodide, silver chlorobromoiodide, silver chlorobromide and others readily apparent to one skilled in the art. Silver bromide and silver bromoiodide are more preferred, the latter silver halide including up to 10 mol % silver iodide.

The silver halide grains preferably utilised in this embodiment may have a uniform ratio of halide throughout, may have a graded halide content with a continuously varying ratio of, for example, silver bromide and silver iodide, or they may be of the core-shell type having a core of one halide ratio and a shell of another halide ratio. Core-shell silver halide grains useful in photothermographic materials and methods of preparing these materials are described, for example in U.S. Pat. No. 5,382,504, which disclosure is incorporated herein by reference, as are the relevant disclosures of U.S. Pat. No. 5,434,043, U.S. Pat. No. 5,939,249 and EP-A-0627660, which describe iridium and/or copper doped core-shell and non-core shell grains.

The secondary source of reducible silver ions may be any silver ion source suitable for use in photothermographic imaging and is preferably a non-photosensitive silver salt that forms a silver image when heated to 50° C. or higher in the presence of an exposed pressure-sensitive or photosensitive silver halide material and a developer composition. The secondary silver ion source may be, for example, one or more of silver benzotriazoles, silver oxalates, silver acetates and silver carboxylates, such as silver behenates, or any silver ion source selected from those described in EP-A-1191394 at page 23 line 17 to page 24, line 14, the disclosure of which is incorporated herein by reference. Preferably, the secondary silver ion source is a silver benzotriazole, suitable such benzotriazoles being disclosed in U.S. Pat. No. 3,832,186, the disclosure of which is incorporated herein by reference, or a silver soap, such a silver behenate, having a formula [Ag(CO$_2$C$_x$H$_{2x-1}$)]$_2$, preferably where x=18-22.

In a heat developable element that may be used according to this embodiment, it is preferred that the pressure sensitive or photosensitive silver halide is present in an amount of from 0.005 to 0.5 moles per mole of secondary silver source, more preferably 0.01 to 0.15 moles and still more preferably 0.03 to 0.12 moles. It is also preferable that the pressure sensitive or photosensitive silver halide is present in an amount of 0.5 to 15% by weight of the emulsion layer in which it is contained and more preferably from 1 to 10% by weight.

In this embodiment in which the latent image is developed through a heat development step, the secondary silver ion source and the silver halide material must be in catalytic proximity (i.e. in reactive association).

The dispersion (or emulsion, as it is often referred in the photographic arts) of the silver halide material and secondary silver ion source may be prepared by any suitable method for use in photothermographic imaging. It is preferred that an ex situ method is used whereby the photosensitive silver halide grains are preformed then added to and physically mixed with the silver ion source, or alternatively, the silver ion source is formed in the presence of ex situ prepared silver halide such as by co-precipitation of the silver ion source in the presence of silver halide to provide a more intimate mixture. The preformed silver halide emulsions or dispersions utilised in this method may be prepared by aqueous or organic processes and can by unwashed or washed to remove soluble salts. Alternatively, an in situ process in which a halide-containing compound is added to an organic silver salt to partially convert the silver of the organic silver salt to silver halide may be effective. The halogen-containing compound may be inorganic (such as zinc bromide or lithium bromide) or organic (such as N-bromosuccinimide). Additional methods of preparing the silver halide and organic silver salts and manners of blending them are described in Research Disclosure, June 1978, Item No. 17029, U.S. Pat. No. 3,700,458 and U.S. Pat. No. 4,076,539, for example.

The pressure-sensitive or photosensitive silver halide material used according to this embodiment may be chemically sensitised and spectrally sensitised, if appropriate, by any suitable method known in the photothermographic art.

The developer composition, which may be incorporated into the coated support, may be any suitable developer for reducing the source of silver ions to metallic silver in photothermographic imaging systems. Suitable such developers include those described in EP-A-1191394 at page 24, line 18 to page 24, line 51, which disclosure is incorporated herein by reference. Particularly preferred developer compositions are the bisphenol class of photothermographic developers.

A development activator, also known as an alkali-release agent, base-release agent or an activator precursor, may be useful in the development of latent images according to the present embodiment. A development activator is an agent or compound, which aids the developing agent, at processing temperatures, to develop a latent image in the imaging material. Useful development activators or activator precursors are described, for example, in Belgian Pat. No. 709, 967 published Feb. 29, 1968, and Research Disclosure, Volume 155, March 1977, Item 15567. Examples of useful activator precursors include guanidinium compounds such as guanidinium trichloroacetate, diguanidinium glutarate, succinate, malonate and the like; quaternary ammonium malonates; amino acids, such as 6-aminocaproic acid and glycine; and 2-carboxycarboxamide activator precursors.

Other addenda that may be incorporated into the coated support to be used in the photothermographic system according to this embodiment, include, for example, stabilisers, toners, anti-foggants, contrast enhancers, development accelerators, post-processing stabilisers or stabiliser precursors and other image-modifying agents, as would be readily apparent to the person skilled in the art. Heat transfer agents may also be incorporated.

The steps of electroless plating and electroplating are largely as described above.

As mentioned above, the conductive tracks formed according to the method of the invention may form the electronic circuitry for various electronic devices. This may be in the form of a single layer of conductive tracks or multiple layers. Where more than two layers of circuitry are used, it is typically desirable to form electrical connections between the conductive patterns each support or on each side of a support coated on both sides. One conductive pattern formed may be connected as desired to another conductive pattern formed by drilling holes or vias through the conductive element(s) and filling or coating the vias with a conductive material.

In a preferred embodiment of the present invention, the pressure-sensitive or photosensitive element has pressure-sensitive or photosensitive material coated onto each side of a support substrate. More preferably, the element is a photosensitive element such as that described in our PCT Application No. PCT/GB2006/001099, the disclosure of which is incorporated herein by reference.

In particular, according to this embodiment, the photosensitive element comprises a first photosensitive layer sensitive to radiation of a first spectral region coated on one side of the support and a second photosensitive layer sensitive to radiation of a second spectral region coated on the other side of the support, whereby upon exposure to radiation of respective first and second spectral regions according to a desired pattern and development of the exposed photosensitive layers the first and second photosensitive layers form developed metal images having a pattern of conductive tracks corresponding to the desired pattern. The first and second spectral regions may be the same, but are preferably different, or at least have different wavelengths of maximum absorption and little overlap. Where the support is transparent, the photosensitive layers may be imaged from the same side of the element. Chemical and spectral sensitisation and the make-up of the photosensitive layers are as described above.

This invention will now be described in more detail, without limitation, with reference to the following Examples and Figure.

EXAMPLES

Example 1 (Comparison)

A photographic film was prepared having an antihalation layer with a protective topcoat on the back side and on the front side an emulsion layer sensitive to red light with a protective topcoat.

The Antihalation Layer:

A dispersion was prepared by dissolving 705 g of lime processed ossein gelatin, after soaking, in 13.3 kg of water at 120° F., adjusting the pH to 5.3 using dilute sulphuric acid. 239 g of 2-(3-acetyl-4-(5-(3-acetyl-1-(2,5-disulfophenyl) -1,5-dihydro-5-oxo-4H-pyrazol-4-ylidene)-1,3-pentadienyl)-5-hydroxy-1H-pyrazol-1-yl)-1,4-benzenedisulfonic acid, pentasodium salt [CAS No 127093-24-7] as a 10% aqueous dispersion was added, followed by 188 g of 4-(4,5-dihydro-4-(5-(5-hydroxy-3-methyl-1-(4-sulfophenyl)-1H-pyrazol-4-yl)-2,4-pentadienylidene)-3-methyl-5-oxo-1H-pyrazol-1-yl)-benzenesulfonic acid [CAS No 27969-56-8] as a 13% aqueous dispersion, followed by 1.1 kg of Ludox™ AM, a 30% silica dispersion available from W. R. Grace, followed by 63.4 g of glycerol [CAS No 56-81-5] as a 63% aqueous solution, followed by 70.5 g of polystyrene sulphonate [CAS No 25704-18-1] as 10% aqueous solution. The whole made up to 15.75 kg.

The Antihalation Layer Protective Topcoat:

A dispersion was prepared by the addition of 3.8 kg of water with 519 g of lime processed ossein gelatin. After soaking, the gelatin was dissolved at 120° F. 465 g of an 8% aqueous dispersion of polymethacrylate matte beads (4-10 µm) was added, followed by 0.5 kg of octamethyl-cyclotetrasiloxane [CAS No 556-67-2] as a 9.3% aqueous dispersion, followed by surfactants to ensure a good coating quality, the pH adjusted to 5.3 and the whole made up to 6 kg.

The two layers were then co-coated such that the gelatin in the antihalation layer was at 2 g/m² and the protective topcoat at 0.488 g/m² onto 7 thou clear subbed Estar™ polyestar base available from Kodak.

Red Sensitive Layer:

A high contrast emulsion consisting of a sulphur and gold sensitised 0.2 µm cubic silver bromochloride (AgBr$_{0.3}$Cl$_{0.7}$) in a binder system was used. The silver halide was sensitised to red light using potassium iodide and a sensitising dye: 5-[3-(carboxymethyl)-5-[2-methyl-1-[(3-methyl-2 (3H)-benzothiazolylidene)methyl]propylidene]-4-oxo-2-thiazolidinylidene]-4-oxo-2-thioxo-3-thiazolidineacetic acid [CAS No 253869-55-5]

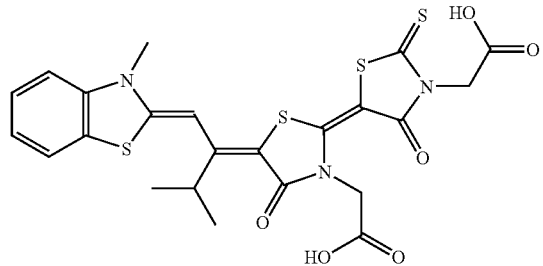

The silver laydown was 3.6 g/m². The binder system consisted of lime processed ossein (LPO) gelatin at 1.6 g/m². The emulsion was protected against fogging by use of a tetra-aza-indene: 7-hydroxy-5-methyl-2-(methyl thio) -(1,2,4)-triazolo(1,5-a)pyrimidine-6-carboxylic acid, a phenyl-mercapto-tetrazole: N-(3-(2,5-dihydro-5-thioxo-1H-tetrazol-1-yl)phenyl)-acetamide, and 2,3-dihydro-2-thioxo-4-thiazoleacetic acid. The viscosity was adjusted to ~6 cP by use of polystyrene sulphonic acid at a pH of 5.1.

Emulsion Topcoat:

A solution was prepared by the addition of 1528 g of water with 64.5 g of lime processed ossein gelatin. After soaking, the gelatin was dissolved at 120° F. 390 g of a 4.7% aqueous solution of acidified hydroquinone was added, followed by 41 g of a dispersion of DC-200™ [CAS No 63148-62-9] in gelatin such that this poly dimethyl siloxane available from Dow Chemical was at a coverage of 45 mg/m². 113 g of a 20% aqueous solution of Tiron™ [CAS No 149-45-1] was added, followed by 137 g of a 10% aqueous solution of a booster (contrast promoting agent)

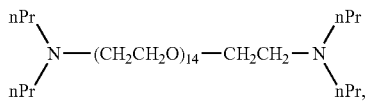

followed by a small amount of surfactant and polystyrene sulphonic acid to aid coating. The pH was adjusted to 5.1. The gelatin laydown for this layer was 0.3 g/m².

The red sensitive layer and topcoat were co-coated onto the previously prepared substrate containing an antihalation layer.

Such a film was then exposed on an Orbotech™ 7008m laser plotter. The image file consisted of a line 1 mm wide, 68 mm long or a 30 mm square.

The film was developed in a tanning developer, which consisted of:

| Solution A | |
|---|---|
| Pyrogallol | 10 g |
| Sodium sulphite | 0.5 g |
| Potassium Bromide | 0.5 g |
| Water to | 500 ml |
| Solution B | |
| Potassium Carbonate | 50 g |
| Water to | 500 ml |

Just prior to use A and B were mixed in a 1:1 ratio (ie 100 ml Solution A+100 ml Solution B).

Development was for ~7 minutes at room temperature (21° C.). The oxidation products from the development harden the gelatin in the exposed areas. The film was then given a 'hot fix'. The film was immersed in Kodak RA 3000™ fix solution at 40° C. for 10 minutes. The gelatin in the unexposed region becomes soft and either melts, dissolves or simply delaminates leaving only the exposed silver as a relief image. Prior art had suggested that the film should be washed with cold water and then warm water to strip the unwanted gelatin away. The 'hot fix' is not only more efficient but also rids the photographic image of a few residual undeveloped silver halide grains. These grains would otherwise become silver in the subsequent plating bath and limit the resolution of the final track.

To ensure that all unwanted gelatin is removed the relief image can be given a wash with a dilute enzyme bath. The enzyme bath is prepared by taking 6.3 g of Takamine powder dissolved in 1.3 l of demineralised water. After 1 hour of stirring, the material is filtered through a 3.0 μm filter, then through a 0.45 μm filter. The final bath is made up of 3 ml of concentrate diluted to 600 g with demineralised water. The enzymolysis takes about 1 minute at room temperature.

The film was then rinsed in cold water for 5 minutes, then dried.

The film was then immersed in an electroless silver plating bath at room temperature for 10 minutes.

The composition of the bath was:

| Part A | |
|---|---|
| ferric nitrate nonahydrate | 20 g |
| citric acid | 10.5 g |
| water to | 250 g |
| warm to >25° C. | |
| ammonium ferrous sulfate.12H$_2$O | 39.2 g |
| water to | 367.5 g |
| DDA** 10% | 2.5 g |
| Lissapol ™ 1 ml in 100 ml | 2.5 g |
| Part B | |
| silver nitrate | 5 g |
| water to | 125 g |
| These were mixed just prior to use. | |
| **DDA 10% | |
| water | 90 ml |
| dodecylamine | 7.5 g |
| acetic acid glacial | 2.5 g |

Example 2

The same film as Example 1 was treated in exactly the same way but the electroplating step took place in an ultrasonic bath. Standard laboratory ultrasonic devices can be used a Dawe Sonicleaner™ for room temperature work or Decon FS200b™ for higher temperatures. This example was done at room temperature.

The results were as set out in Table 1:

TABLE 1

| | Resistance (ohms) | | | |
|---|---|---|---|---|
| Process | Line 1 | Line 2 | Square | Background |
| Example 1 | 50 | 51 | 12 | Discoloured with unwanted silver deposits |
| Example 2 (with ultrasonic electroless plating) | 27 | 30 | 4 | Clean |

Line 2 arises as a repeat with another piece of film at a later date.

Example 3

Four pieces of film were prepared in the same way as in Example 2. Each film was exposed with a mesh pattern, essentially of squares with a bus bar connector at each end. The mesh consisted of fine wires separated by a distance as given in Table 2, below. The optical transmission and sheet resistivity of the mesh was then measured. The results are shown in Table 2, below.

TABLE 2

| Centre point to centre point separation of wires/μm | Wire Thickness/μm | Sheet Resistance/Ω/□ | Optical Transmission |
|---|---|---|---|
| 1000 | <15 | 5.7 | 95.7% |
| 500 | <15 | 3.4 | 91.6% |
| 250 | <15 | 7.0 | 90.2% |
| 1000 | <25 | 2.6 | 91.2% |

This method is capable of producing extremely fine wires with a high conductivity and a clarity/transmission of greater than 90%. Such conductive meshes have potential for use in devices such as touchscreens, heaters, transparent electrodes etc. Competing technologies such as silk screen printing cannot achieve such fine lines and other techniques cannot typically achieve the conductivity and clarity achieved here.

Example 4

An article was prepared in a similar manner to that of Example 2 except that the substrate was resin coated paper with an anti-halation layer. The emulsion and protective topcoat were co-coated over the anti-halation layer. The emulsion layer was adjusted to only have 1.32 g/m$^2$ of gelatin taking in to account the gelatin in the anti-halo layer.

The anti-halation layer was prepared by the addition of 912 g of water with 7.4 g of lime processed ossein gelatin. After soaking, the gelatin was dissolved at 120° F. 27.1 g of a 10% aqueous slurry of B-22464-TEA-S dye [CAS No. 115311-00-7] followed by a small amount of surfactant and polystyrene sulphonic acid to aid coating. The pH was adjusted to 5.1. The gelatin laydown for this layer was 0.3 g/m$^2$. That of the dye was 110 mg/m$^2$.

The film was exposed with a track pattern, tan developed as described above and physically developed for only ten minutes. This gave a 900 µm by 120 mm conductive black track separated from its neighbour by 100 µm with a resistance of 250 ohms, ca. 2 Ω/sq.

This film, when exposed with a similar track pattern 987.5 µm wide with a gap of 12.5 µm, but physically developed for only 1 minute, gave a resistance of 2.5 kΩ, ca. 20 Ω/sq.

Both patterns could find use as a non-reflective conductive backplane for display devices, specifically those based upon cholesteric liquid crystals.

The invention claimed is:

1. A process for preparing a patterned electrical conductor comprising a conductive track pattern on a support, said process comprising the steps of
    providing a pressure-sensitive or photosensitive element comprising
        a support substrate; and
        a pressure-sensitive or photosensitive material coated onto said support, said pressure-sensitive or photosensitive material being capable of providing a latent image upon exposure to pressure or sensitising radiation and comprising a pressure-sensitive or photosensitive metal salt dispersed in a binder;
    exposing said pressure-sensitive or photosensitive element to pressure or sensitising radiation according to a desired conductive track pattern to form a latent image on said element;
    subjecting said latent image to a conventional-development step to form said developed element having an image formed by a first metal corresponding to said desired conductive track pattern, together with non-imaged areas; and
    electroless plating and/or electroplating said metal image with a plating of a second metal to improve the conductivity of said metal image, wherein during said electroless plating and/or electroplating step(s) said developed element is subjected to ultrasonic agitation.

2. The process of claim 1, wherein said development step comprises a wash-off process, whereby said binder is substantially removed from said non-imaged areas of said developed element.

3. The process of claim 1, wherein said development step comprises a hot fix step, whereby said binder is substantially removed from said non-imaged areas of said developed element.

4. The process of claim 1, wherein said binder in said pressure-sensitive or photosensitive material is susceptible to decomposition and/or dissolution upon treatment with a solution comprising an enzyme and the process further comprises treating said developed element, prior to and/or during said plating step(s), with said enzyme capable of decomposing and/or dissolving said binder.

5. The process of claim 1, wherein said photosensitive material comprises a silver halide emulsion in gelatin and said first metal is silver.

6. The process of claim 5, wherein said silver halide is present in an amount of at least 1 g/m$^2$.

7. The process of claim 1, wherein said second metal is selected from silver, gold, zinc, lead copper or nickel.

8. The process of claim 7, wherein said second metal is silver.

9. The process of claim 8, wherein said electroplating step comprises applying a voltage across the developed metal image in the presence of a solution of a silver thiosulfate complex.

10. The process of claim 9, wherein said silver thiosulfate solution is present in a concentration of from 0.01 to 0.1 molar.

11. The process of claim 1, wherein said metal image formed by said first metal is capable of conducting when a voltage is applied across it, prior to any plating step.

* * * * *